(12) United States Patent
Kim

(10) Patent No.: US 6,352,922 B1
(45) Date of Patent: Mar. 5, 2002

(54) METHOD OF FABRICATION OF A SEMICONDUCTOR DEVICE HAVING A DOUBLE LAYER TYPE ANTI-REFLECTIVE LAYER

(75) Inventor: Yong-beom Kim, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/549,176

(22) Filed: Apr. 13, 2000

(30) Foreign Application Priority Data

Jul. 14, 1999 (KR) .............................. 99-28404

(51) Int. Cl.⁷ ......................................... H01L 21/4763
(52) U.S. Cl. ........................ 438/648; 438/636; 257/437
(58) Field of Search ........................ 438/648, 48, 72, 438/636; 257/437

(56) References Cited

U.S. PATENT DOCUMENTS

| | | | | |
|---|---|---|---|---|
| 5,569,501 A | * | 10/1996 | Bailey et al. | ............... 427/577 |
| 5,733,712 A | | 3/1998 | Tanaka et al. | ............... 430/314 |
| 5,846,693 A | * | 12/1998 | Tanaka et al. | ............... 430/311 |
| 5,986,318 A | * | 11/1999 | Kim et al. | ................... 257/437 |

* cited by examiner

*Primary Examiner*—David Nelms
*Assistant Examiner*—Dung Ang Le
(74) *Attorney, Agent, or Firm*—The Law Offices of Eugene M. Lee, P.L.L.C.

(57) ABSTRACT

A semiconductor device having a double layer type anti-reflective layer, which can reduce reflectivity in a photolithography process using, for example, an exposure light source of a 193 nm wavelength region and which can suppress intermixing at the boundary between an anti-reflective layer and a photoresist layer, and a fabrication method of the semiconductor device are disclosed. The semiconductor device includes an underlying layer having a high reflectivity formed on a semiconductor substrate, a double layer type anti-reflective layer formed of a nitride layer and a layer formed using only hydrocarbon-based gas on the underlying layer, and a photoresist layer formed on the double layer type anti-reflective layer. In the double layer type anti-reflective layer, the nitride layer and the layer formed using only hydrocarbon-based gas can be sequentially stacked. Also, it is possible that the layer formed using only hydrocarbon-based gas and the nitride layer are sequentially stacked.

10 Claims, 5 Drawing Sheets

METHOD OF FABRICATION OF A SEMICONDUCTOR DEVICE HAVING A DOUBLE LAYER TYPE ANTI-REFLECTIVE LAYER

BACKGROUND OF THE INVENTION

1. Field of the Invention

The present invention relates to a semiconductor device and a fabrication method thereof. More particularly, the present invention relates to a semiconductor device having at least a double layer type anti-reflective layer used in a photolithography process, and the method of fabricating the dual layer type anti-reflective layer disposed on the semiconductor device.

2. Description of the Related Art

In the process of fabricating semiconductor devices having a design rule of 0.13 μm or less, an ArF laser is used as an exposure light source in a photolithography process. A silicon oxynitride (SiON) layer is generally used as an anti-reflective coating when a KrF laser is used as an exposure light source, since an optimized anti-reflective layer has yet to be developed. However, if a KrF laser is used, intermixing may occur at the boundary between a chemically amplified resist and an anti-reflective layer, resulting in a phenomenon called "footing" in which the lower portion of a photoresist pattern is rounded, rather than rectangular. Also, although organic anti-reflective layers for an ArF laser have been partially developed, optimum layers have yet to be found.

FIGS. 1 and 2 are diagrams showing a semiconductor device employing a typical anti-reflective layer. FIG. 1 is a cross-sectional view taken when a silicon oxynitride layer (SiON) layer is used as an anti-reflective layer. In FIG. 1, bottom layer 52 having a step difference is formed on semiconductor substrate 50, and an underlying layer 54 having a high reflectivity is formed on bottom layer 52. Subsequently, anti-reflective layer 68 formed of silicon oxynitride (SiON) is deposited on the underlying layer 54. Then, a chemically amplified photoresist layer is coated on the anti-reflective layer 68 to then carry out exposure and development, thereby forming a photoresist pattern 56. Here, anti-reflective layer 68 suppresses ripple occurring in the profile of photoresist pattern 56 by the light reflected from the boundary between the photoresist layer and underlying layer 54. Anti-reflective layer 68 also inhibits notching, a phenomenon in which photoresist pattern 56 is narrowed in a "V" shape before cutting, thereby accurately controlling the line width in forming a fine pattern. In other words, the anti-reflective layer causes offset-interference with respect to the light reflected from the boundary between the photoresist layer and underlying layer 54.

However, intermixing occurs at the boundary between the silicon oxynitride layer (SiON) used as anti-reflective layer 68 and the chemically amplified photoresist layer so that footing 60 becomes severe. Footing 60 occurs via the reaction of OH and $NH_x$ groups in the boundary between anti-reflective layer 68 and the chemically amplified photoresist layer so that the lower portion of the photoresist pattern is not formed at a right angle but is rounded. Here, the OH group is generated from the chemically amplified photoresist layer, and the NHx group is generated from the SiON layer.

FIG. 2 is a graph showing the reflectivity versus the change in thicknesses of an anti-reflective layer when silicon oxynitride (SiON) is used as the anti-reflective layer. Here, the refractive index (n) for the photoresist layer and the anti-reflective layer is 1.8, and the extinction coefficient (k) for the photoresist layer and the anti-reflective layer is 1. The extinction coefficient represents the degree to which an arbitrary light ray is transmitted through a layered material. For this example, a silicon layer is used as underlying layer 54. When the thickness of anti-reflective layer 68 is about 200 angstroms, the reflectivity is about 5%.

A conventional method of fabricating semiconductor devices in which a double layer type anti-reflective layer is used is disclosed in U.S. Pat. No. 5,733,712, entitled "Resist Pattern Forming Method Using Anti-Reflective layer, Resist Pattern Formed, and Method of Etching Using Resist Pattern and Product Formed", issued on Mar. 31, 1998. This patent discloses a technology in which a silicon oxynitride (SiON) layer and a metal layer are used as a double layer type anti-reflective layer. This patent fails to take into consideration intermixing at the boundary between the chemically amplified photoresist layer and a silicon oxynitride layer (SiON).

SUMMARY OF THE INVENTION

To solve the above problems, the present invention preferably provides a semiconductor device having a double layer type anti-reflective layer, which has a low reflectivity even when an ArF laser is used as an exposure light source. A further feature of the present invention is the suppression of intermixing at the boundary between a photoresist layer and an anti-reflective layer.

Still another feature of the present invention is to provide a method of fabricating a semiconductor device having the double layer type anti-reflective layer.

Accordingly, to achieve the above features of the present invention, a semiconductor device including an underlying layer having a high reflectivity is formed on a semiconductor substrate. A double layer type anti-reflective layer formed of a nitride layer and a layer formed using only hydrocarbon-based gas is formed on the underlying layer, and a photoresist layer is formed on the double layer type anti-reflective layer.

According to a preferred embodiment of the present invention, the double layer type anti-reflective layer is preferably a layer in which a nitride layer and a layer formed using only hydrocarbon-based gas are sequentially formed, or a layer in which a layer formed using only hydrocarbon-based gas and a nitride layer are sequentially formed.

Preferably, the nitride layer has a refractive index of between 2 and 3 with respect to an exposure light source, and has an extinction coefficient of between 0.01 and 0.21.

It is desirable that the layer formed using only the hydrocarbon-based gas be an amorphous carbon layer, containing an additive agent which is one of oxygen, tin, lead, silicon, fluorine and chlorine. Also, the amorphous carbon layer preferably has a refractive index of between 1.4 and 2.5 with respect to an exposure light source, and the amorphous carbon layer preferably has an extinction coefficient of between 0.01 and 0.21.

According to another aspect of the present invention, a method of forming a semiconductor device having a double layer type anti-reflective layer is disclosed. The method includes forming an underlying layer having a high reflectivity on a semiconductor substrate, depositing a nitride layer as a first anti-reflective layer on the underlying layer, depositing a layer formed using only hydrocarbon-based gas as a second anti-reflective layer on the first anti-reflective layer, and coating a photoresist pattern on the second anti-reflective layer.

Preferably, in the step of forming the underlying layer, the material of the underlying layer is selected from the group consisting of tungsten, tungsten silicide ($WSi_x$), titanium silicide ($TiSi_x$), aluminum and aluminum alloy. Also, in the step of depositing the layer formed of a hydrocarbon-based gas, the hydrocarbon-based gas is preferably selected from the group consisting of methane, ethane, propane, butane, acetylene, propene and n-butane.

In the step of forming the second anti-reflective layer, the second anti-reflective layer may be formed by plasma enhanced chemical vapor deposition (PECVD). Also, after forming the second anti-reflective layer, the method may include performing one step selected from the group consisting of annealing, RF plasma treatment, E-beam treatment, and curing, to increase the density of the layer.

According to the present invention, in the photolithography process in which an ArF laser is used as an exposure light source, the thickness of an anti-reflective layer is appropriately adjusted, to lower the reflectivity. Also, the stability of a layer material of an amorphous carbon layer used in the present invention, in which only hydrocarbon-based gases are used, can prevent intermixing occurring at the boundary between the photoresist layer and the anti-reflective layer. Further, in the photolithography process using an ArF laser in which a relatively thin photoresist layer is employed, the double layer type anti-reflective layer according to the present invention can function as a hard mask which is advantageous in an etching process. Also, since the layer formed by using only the hydrocarbon-based gas according to the present invention can be removed by a process of removing a photoresist without a separate removal process, the fabrication process can be simplified.

BRIEF DESCRIPTION OF THE DRAWINGS

The features noted above and other features and advantages of the present invention, as well as the method of manufacturing the present invention, will become more apparent by describing in detail preferred embodiments thereof with reference to the attached drawings in which.

DESCRIPTION OF THE PRESENTLY PREFERRED EXEMPLARY EMBODIMENTS

Korean patent application No. 99-28404 filed on Jul. 14, 1999, entitled "Semiconductor Device Having Double Layer Type Anti-reflective Layer and Fabrication Method Thereof" is incorporated by reference herein in its entirety. Preferred embodiments of the present invention will be described below in detail with reference to the attached drawings.

FIGS. 3 through 6 are cross-sectional views illustrating a semiconductor device employing a double layer type anti-reflective layer according to a first embodiment of the present invention and a method of fabricating the same.

Figure 1:
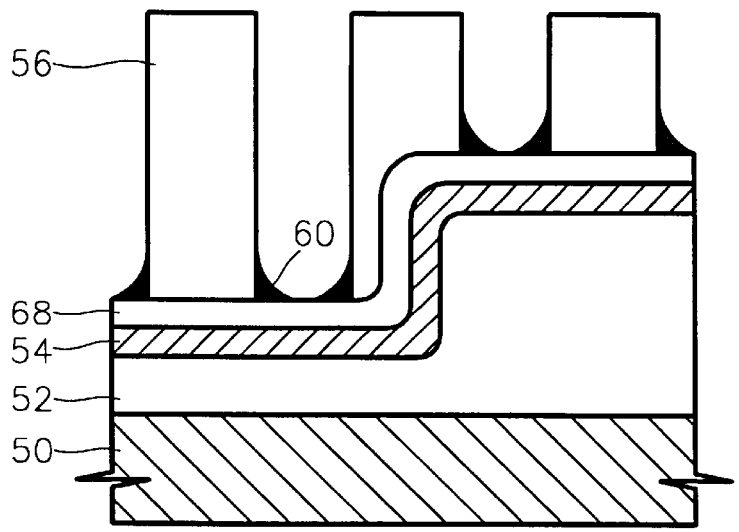
FIGS. 1 and 2 are diagrams illustrating a known semiconductor device employing a general anti-reflective layer.
Figure 2:
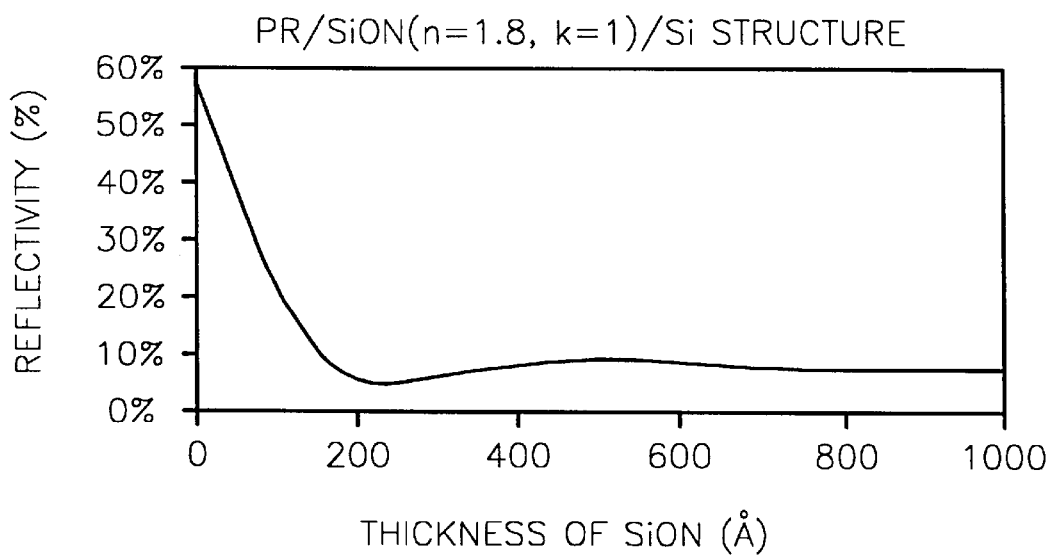
Figure 3:
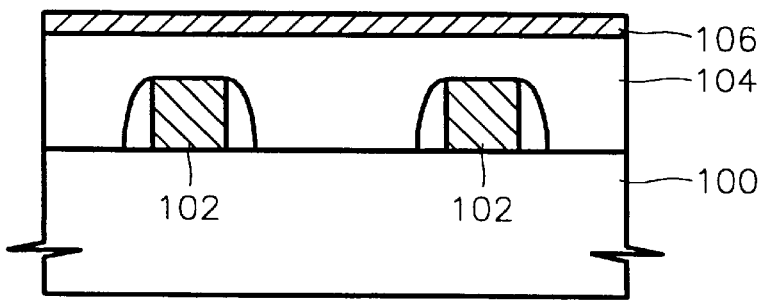
FIGS. 3 through 6 are cross-sectional views illustrating a semiconductor device employing a double layer type anti-reflective layer according to a first embodiment of the present invention and the fabrication method thereof.

FIG. 3 illustrates a sub-structure such as a gate pattern 102 formed on a semiconductor substrate 100 using one of a single crystal silicon substrate, a silicon-on-insulator (SOI) substrate, a silicon-on-sapphire (SOS) substrate and a gallium arsenide substrate. An interlayer dielectric layer 104 is then formed on the substrate 100. Subsequently, an underlying layer 106 having a high reflectivity, which is to be etched by a double layer type anti-reflective layer according to the present invention, is formed on interlayer 104. The underlying layer 106 may be formed of tungsten, tungsten silicide, titanium silicide, aluminum, aluminum alloy, polysilicon, cobalt, copper and the like. Also, it is assumed that the underlying layer 106 has a step difference which is produced in the process of forming the sub-structure such as the gate pattern.

Figure 4:
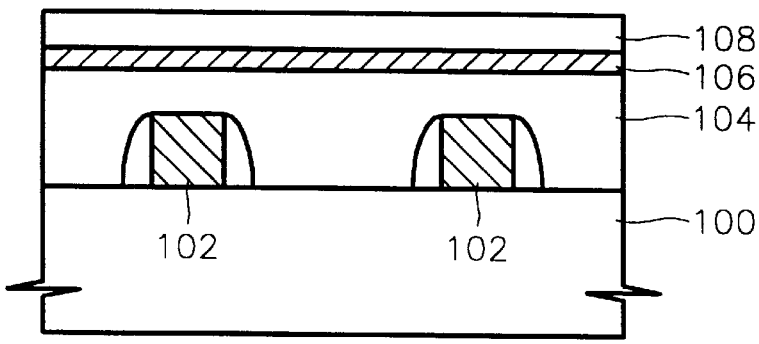

In FIG. 4, an anti-reflective layer having a double layer structure according to the present invention (shown as 114 in FIG. 6) is formed on the resultant structure having the underlying layer 106. In this embodiment, a nitride layer (SiN) 108 is first formed. The thickness of the nitride layer 108 as a first anti-reflective layer is varied according to the material of the underlying layer 106. Also, in order to reduce the reflectivity, it is appropriate that the nitride layer 108 has a refractive index of between 2 and 3 with respect to an ArF laser which is used as an exposure light source, and has an extinction coefficient of between 0.01 and 0.21.

Figure 5:
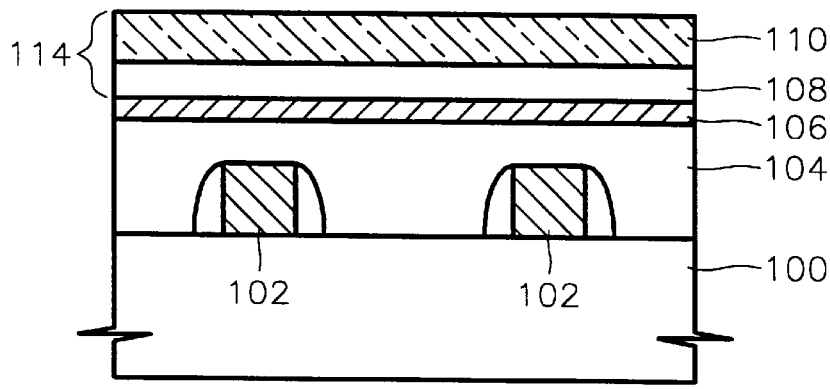

FIG. 5 depicts a layer 110 formed using only hydrocarbon-based gas. The layer 110 is a second anti-reflective layer and is formed on the nitride layer 108 by, for example, a plasma enhanced chemical vapor deposition (PECVD) method. Thus, a double layer type anti-reflective layer 114 according to the present invention is formed. Here, according to the PECVD method, the layer 110 is formed in a chamber while applying a temperature of 0 to 500 degrees Celsius to the lower and upper portion of a substrate on which a wafer is to be placed, thereby controlling the characteristics of the layer 110. Instead of helium gas, only hydrocarbon-based gases are used as carrier gases in the PECVD chamber. The hydrocarbon-based gas is one selected from the group consisting of methane, ethane, propane, butane, acetylene, propene and n-butane. In other words, various types of reactions sources of both gaseous and liquid states can be used.

For example, a methane ($CH_4$) gas is used as the hydrocarbon-based gas which forms the layer 110. Also, a second anti-reflective layer having a desired refractive index, layer composition and chemical properties can be obtained by adding an additive agent including oxygen, tin, lead, silicon, fluorine and chlorine as well as the methane gas. Here, the refractive index of the second anti-reflective layer, that is, the layer 110 formed using only hydrocarbon-based gas, ranges from 1.4 to 2.5, and the extinction coefficient of the second anti-reflective layer, i.e., layer 110, ranges from 0.05 to 0.8. Here, the refractive index means the degree to which an arbitrary light ray is refracted while passing through the boundary between two different layers.

Subsequently, the layer 110 is in-situ annealed to increase the density of the layer. Alternatively, radio frequency (RF) plasma treatment, E-bean treatment or curing is carried out, thereby adjusting the layer 110's characteristics and density. The thickness of the layer 110 is adjusted to be between 100 and 2000 angstroms depending upon the material of the underlying layer 106. Generally, if the underlying layer 106 is an insulation layer, the thickness of layer 110 is decreased. If the underlying layer 106 is a conductive layer, the thickness of layer 110 is increased.

Since the layer 110 formed using only the hydrocarbon-based gas can be removed by ashing or cleaning, the process is simplified. Also, since the anti-reflective layer is formed by using a relatively inexpensive gas, such as methane, the fabrication cost can be reduced.

Figure 6:
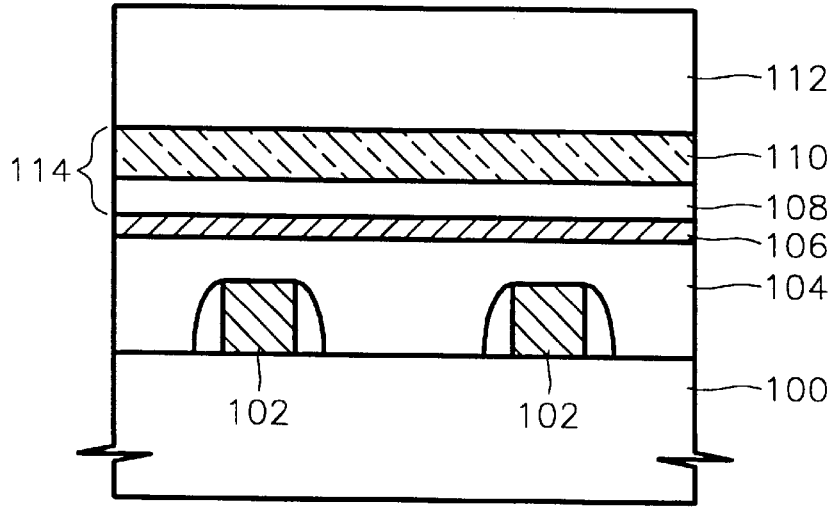

FIG. 6 illustrates a photoresist layer 112, e.g., a chemically amplified photoresist layer, which is coated on the resultant structure having the double layer type anti-reflective layer 114. Generally, in a photolithography process using an ArF laser as an exposure light source, a relatively thin photoresist layer is required. Since the layer 110 is formed using only the hydrocarbon-based gas according to the present invention, layer 110 can function as an additional hard mask together with a photoresist pattern in an etching process. Layer 110 can be easily adopted to the process of using an ArF laser and an anti-reflective layer.

Figure 7:
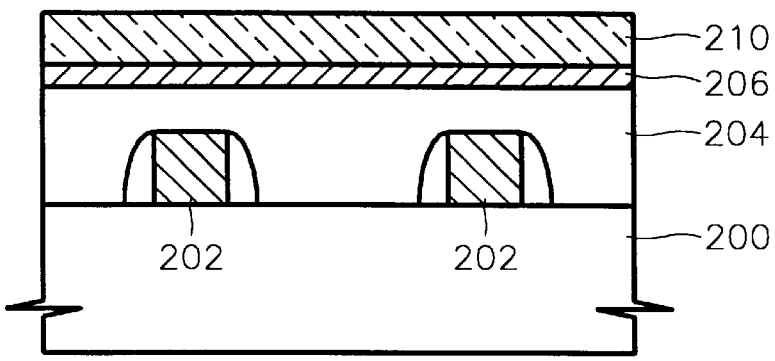
FIGS. 7 through 9 are cross-sectional views illustrating a semiconductor device employing a double layer type anti-reflective layer according to a second embodiment of the present invention and the fabrication method thereof.
Figure 8:
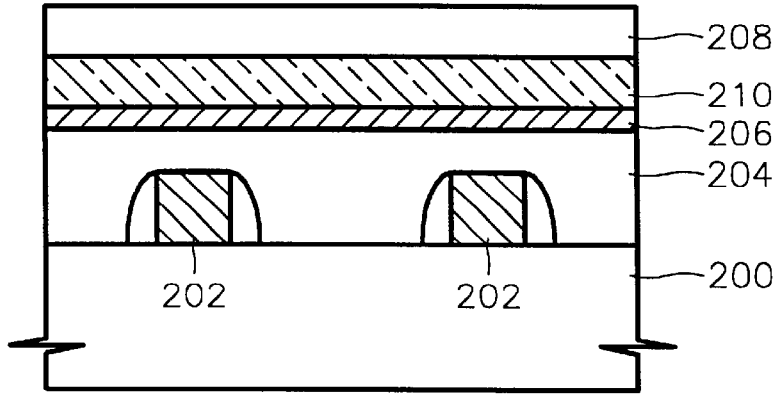
Figure 9:
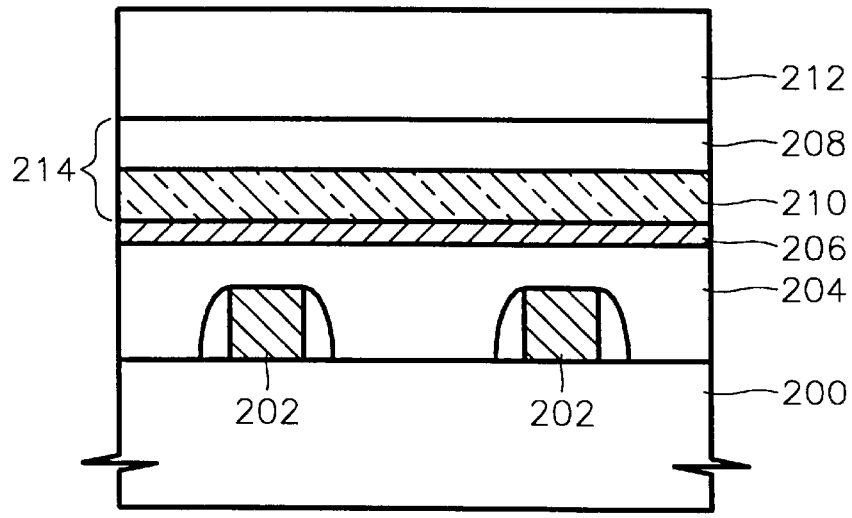

FIGS. 7 through 9 are cross-sectional views illustrating a semiconductor device using a double layer type anti-reflective layer according to a second embodiment of the present invention and a method of fabricating the structure.

This embodiment is the same as the first embodiment except that the positions of the nitride layer and the layer formed using hydrocarbon-based gas in the double layer type anti-reflective layer are reversed, and therefore, a detailed explanation of the structure and process will be omitted. Also, for better understanding of the invention, the same elements are designated by corresponding reference numerals as those used in connection with the first embodiment.

FIGS. 7 through 9 depict a sub-structure such as a gate pattern 202 or an interlayer dielectric film 204, which are formed on a semiconductor substrate 200. Subsequently, an underlying layer 206 having a high reflectivity is deposited on the resultant structure. The underlying layer 206 is to be etched,. Thereafter, a layer 210 formed using only hydrocarbon-based gas according to the present invention is deposited as a first anti-reflective layer. A nitride layer 208 is formed on the first anti-reflective layer as a second anti-reflective layer, thereby forming a double layer type anti-reflective layer 214. Finally, a chemically amplified photoresist layer 212 is coated on the double layer type anti-reflective layer 214.

In this embodiment, since silicon oxynitride (SiON) is not used as an anti-reflective layer adjacent to the photoresist layer 212, the generation of OH and $NH_x$ after carrying out exposure and development, can be prevented. Therefore, footing due to intermixing of OH and $NH_x$ can be prevented.

EXAMPLES

Figure 10:
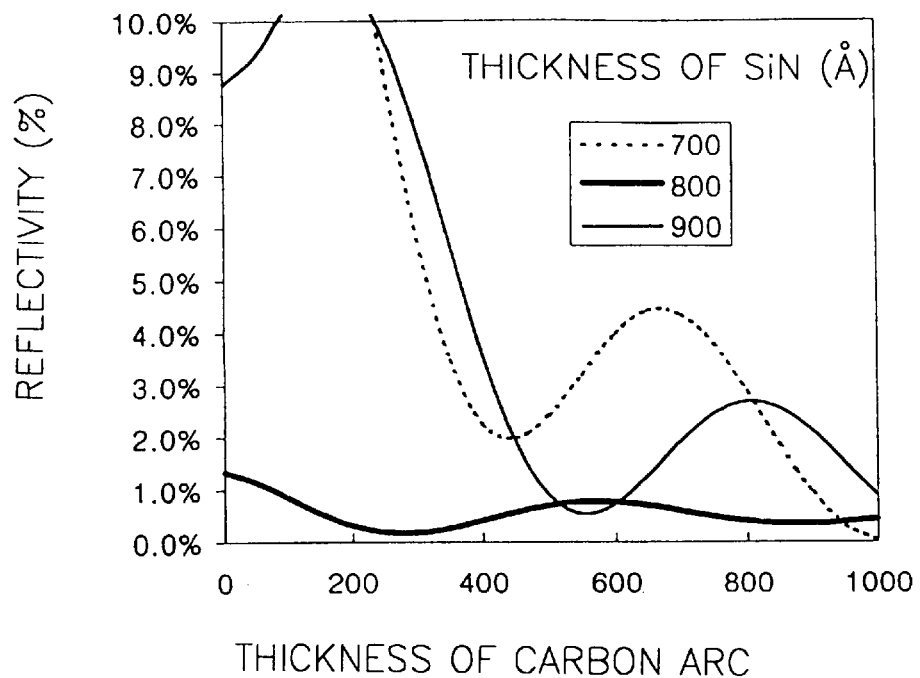
FIGS. 10 through 12 are simulation graphs illustrating the dependence of the reflectivity on the thickness of an anti-reflective layer when the anti-reflective layer is formed according to the first embodiment of the present invention.
Figure 11:
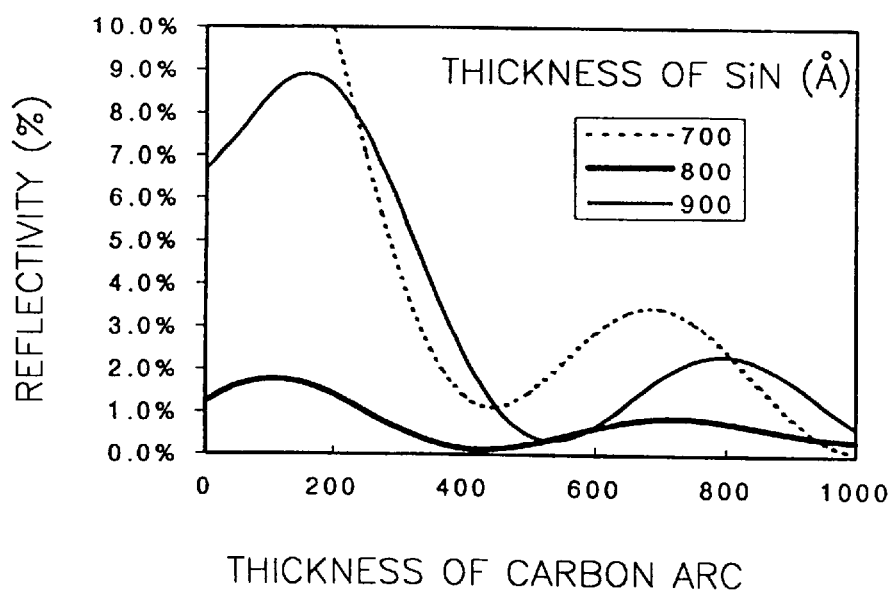
Figure 12:
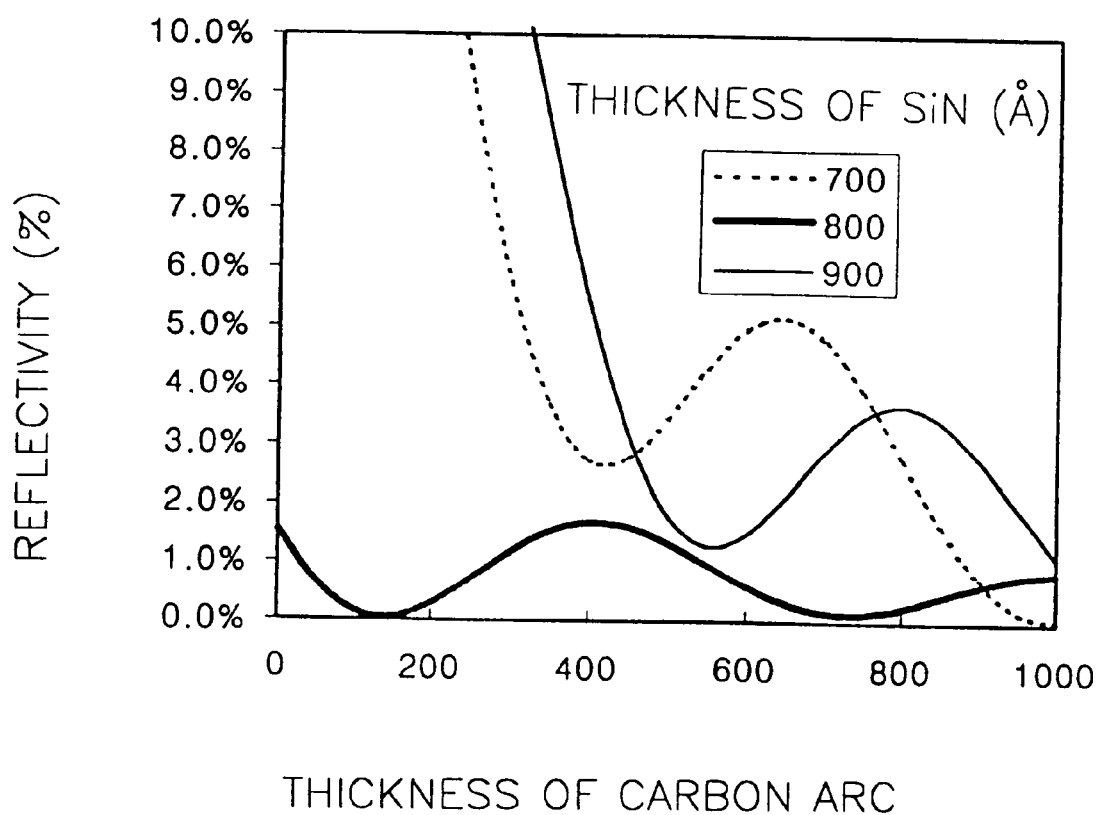

FIGS. 10 through 12 are simulation graphs illustrating the dependence of the reflectivity on the thickness of an anti-reflective layer when the anti-reflective layer is formed according to the first embodiment.

FIG. 10 shows simulation results illustrating the dependence of the reflectivity on the thickness of a double layer type anti-reflective layer. A 193 nm ArF laser is used as an exposure light source, a silicon layer is used as an underlying layer, and a material layer formed by sequentially stacking a nitride layer and an amorphous carbon layer is used as the double layer type anti-reflective layer. The thicknesses of the nitride layers are 700 angstroms, 800 angstroms, and 900 angstroms. The thickness of the amorphous carbon layer varies between 0 and 1000 angstroms. When the thicknesses of the nitride layer lies in the range of from 700 to 900 angstroms, and the thickness of the amorphous carbon layer is in the range of 350 to 550 angstroms, the reflectivity is less than 3%, which is an improvement over the conventional structures, which typically have a 5% reflectivity.

FIG. 11 shows the simulation result of the dependence of the reflectivity on a change in thicknesses of a double layer type anti-reflective layer. An ArF laser of 193 nm is used as an exposure light source, a tungsten silicide ($WSi_x$) is used as the underlying layer, and a nitride layer and an amorphous carbon layer, which are sequentially stacked, are used as the double layer type anti-reflective layer. As in FIG. 10, the thickness of an amorphous carbon layer is in the range of 350 to 550 angstroms and the reflectivity is less than 3% when the thickness of an amorphous carbon layer is between 700 and 900 angstroms, which again is an improvement over the typical 5% reflectivity in the conventional art.

FIG. 12 shows the simulation result of the dependence of the reflectivity on a change in thicknesses of a double layer type anti-reflective layer. An ArF laser of 193 nm is used as an exposure light source, an aluminum conductive layer is used as the underlying layer, and a nitride layer and an amorphous carbon layer, which are sequentially stacked, are used as the double layer type anti-reflective layer. The thickness of an amorphous carbon layer is in the range of 80 to 100 angstroms and the reflectivity is less than 3% when the thickness of an amorphous carbon layer is between 700 and 900 angstroms, which also is an improvement as compared to the 5% reflectivity in the conventional art.

According to the simulation results, it is understood that the reflectivity can be improved during a photolithography process in which an ArF laser is used as an exposure light source by using a double layer type anti-reflective layer according to the present invention. In the double layer type anti-reflective layer, a nitride layer and an amorphous carbon layer are sequentially stacked, and the double layer type anti-reflective layer can be applied to a photolithography process without any difficulty.

Furthermore, according to the present invention:

First, the reflectivity can be reduced by appropriately controlling the thickness of an anti-reflective layer, in a photolithography process in which an ArF laser is used as an exposure light source.

Second, also, the stability of a layer material made of an amorphous carbon layer as used in the present invention, with only hydrocarbon-based gases being used, can prevent intermixing occurring at the boundary between the photoresist layer and the anti-reflective layer, thereby suppressing footing.

Third, in the photolithography process using an ArF laser in which a relatively thin photoresist layer is employed, the double layer type anti-reflective layer can function as a hard mask, which is advantageous in an etching process.

Fourth, since the layer formed by using only the hydrocarbon-based gas according to the present invention can be removed by the same process as removing the photoresist, a separate removal process is not required. Thus, the fabrication process can be simplified.

Fifth, since the anti-reflective layer is formed, for example, of relatively inexpensive methane ($CH_4$) gas, the fabrication cost can be reduced.

While the present invention is described herein with reference to illustrative embodiments for particular applications, it should be understood that the invention is not limited thereto. Those having ordinary skill in the art and access to the teachings provided herein will recognize additional modifications, applications, embodiments and substitution of equivalents all fall within the scope of the invention. Accordingly, the invention is not to be considered as limited by the foregoing description, but instead is limited by the scope of the appended claims.

What is claimed is:

1. A method of fabricating a semiconductor device having a double layer anti-reflective layer, said method comprising the steps of:

forming an underlying layer having a high reflectivity on a semiconductor substrate;

depositing a nitride layer as a first anti-reflective layer on the underlying layer;

depositing an amorphous carbon layer using only hydrocarbon-based gas without a carrier gas as a second anti-reflective layer on the first anti-reflective layer; and coating a photoresist pattern on the second anti-reflective layer.

2. The method according to claim 1, wherein the step of forming an underlying layer includes the step of selecting the material of the underlying layer from the group consisting of tungsten, tungsten silicide ($WSi_x$), titanium silicide ($TiSi_x$), aluminum, and aluminum alloy.

3. The method according to claim 1, wherein the step of depositing the layer formed only of hydrocarbon-based gas includes the step of selecting the hydrocarbon-based gas from the group consisting of methane, ethane, propane, butane, acetylene, propene and n-butane.

4. The method according to claim 1, wherein the step of forming the second anti-reflective layer includes the step of using plasma enhanced chemical vapor deposition (PECVD).

5. The method according to claim 1 further comprising, after forming the second anti-reflective layer in the step of depositing the layer formed only of hydrocarbon-based gas, performing one step selected from the group consisting of annealing, RF plasma treatment, E-beam treatment, and curing, to increase the density of the second anti-reflective layer.

6. A method of fabricating a semiconductor device having a double layer anti-reflective layer, said method comprising the steps of:

forming an underlying layer having a high reflectivity on a semiconductor substrate;

depositing an amorphous carbon layer using only hydrocarbon-based gas without a carrier gas as a first anti-reflective layer on the underlying layer;

depositing a nitride layer as a second anti-reflective layer on the first anti-reflective layer; and coating a photoresist pattern on the second anti-reflective layer.

7. The method according to claim 6, wherein the step of forming the underlying layer, includes the step of selecting the underlying layer from the group consisting of tungsten, tungsten silicide ($WSi_x$), titanium silicide ($TiSi_x$), aluminum and aluminum alloy.

8. The method according to claim 6, wherein the step of depositing a layer formed using only hydrocarbon-based gas includes the step of selecting the hydrocarbon-based gas from the group consisting of methane, ethane, propane, butane, acetylene, propene, and n-butane.

9. The method according to claim 1, wherein the step of depositing a layer formed using only hydrocarbon-based gas includes the step of forming the first anti-reflective layer by plasma enhanced chemical vapor deposition (PECVD).

10. The method according to claim 6 further comprising, after forming the first anti-reflective layer, performing a step selected from the group consisting of annealing, RF plasma treating, E-beam treating, and curing, to increase the density of the first anti-reflective layer.

* * * * *